(12) United States Patent
Tozawa et al.

(10) Patent No.: US 9,105,586 B2
(45) Date of Patent: Aug. 11, 2015

(54) ETCHING OF SILICON OXIDE FILM

(75) Inventors: Shigeki Tozawa, Nirasaki (JP); Yusuke Muraki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1709 days.

(21) Appl. No.: 12/078,958

(22) Filed: Apr. 8, 2008

(65) Prior Publication Data
US 2008/0254636 A1 Oct. 16, 2008

(30) Foreign Application Priority Data

Apr. 13, 2007 (JP) ................................ 2007-105434

(51) Int. Cl.
H01L 21/306 (2006.01)
H01L 21/311 (2006.01)
H01L 21/67 (2006.01)

(52) U.S. Cl.
CPC .... H01L 21/31138 (2013.01); H01L 21/67069 (2013.01); H01L 21/67155 (2013.01)

(58) Field of Classification Search
CPC ............... H01L 21/31138; H01L 21/67069; H01L 21/67155
USPC .................................................. 156/345.22
See application file for complete search history.

(56) References Cited

U.S. PATENT DOCUMENTS 5,164,034 A * 11/1992 Arai et al. ............... 156/345.31
6,143,128 A * 11/2000 Ameen et al. ........... 156/345.24
6,566,228 B1 * 5/2003 Beintner et al. .............. 438/430
2005/0124084 A1 * 6/2005 Shimizu et al. ................ 438/14
2006/0255469 A1 11/2006 Eimori

FOREIGN PATENT DOCUMENTS

| JP | 8-130195 A | 5/1996 |
| JP | 2002-100602 A | 4/2002 |
| JP | 2002-198349 A | 7/2002 |
| JP | 2002-313952 | 10/2002 |
| JP | 2003-77901 A | 3/2003 |
| JP | 2003-142576 | 5/2003 |
| KR | 1998-086841 | 12/1998 |
| KR | 10-0682163 | 2/2007 |

OTHER PUBLICATIONS

Office Action mailed on Jun. 21, 2011, in Japanese Patent Application No. 2007-105434 (partial translation).
Office Action mailed on Oct. 12, 2011, in Taiwan Patent Application No. 097113337 (partial translation).

* cited by examiner

*Primary Examiner* — Parviz Hassanzadeh
*Assistant Examiner* — Nathan K Ford
(74) *Attorney, Agent, or Firm* — Smith, Gambrell & Russell LLP.

(57) ABSTRACT

An etching method includes preparing a target object such that a first oxide film made of silicon oxide containing at least one of B and P is formed on a substrate, a second oxide film made of silicon oxide containing neither of B and P is formed on the first oxide film, and a contact portion is present below an interface between the first oxide film and the second oxide film. The etching method further includes etching the second oxide film and the first oxide film, thereby forming a hole reaching the contact portion, and etching the first oxide film by a dry process using a gas containing HF, thereby expanding a portion of the hole adjacent to an upper side of the contact portion and inside the first oxide film.

6 Claims, 7 Drawing Sheets

ETCHING OF SILICON OXIDE FILM

BACKGROUND OF THE INVENTION

1. Field of the Invention

The present invention relates to an etching method, etching system, and etching apparatus for etching a silicon oxide film formed on a substrate to form a hole, such as a storage node hole or contact hole, which reaches a contact portion.

2. Description of the Related Art

In recent years, along with an increase in integration of semiconductor devices, miniaturization of pattern sizes has been making remarkable progress. For example, in the process of manufacturing DRAMs, capacitor electrodes having a cylindrical shape need to be thinner while they need to be higher to increase the capacitance. Further, the storage node holes need to have a higher aspect ratio. The contact holes also need to have a higher aspect ratio.

Jpn. Pat. Appln. KOKAI Publications No. 2002-313952 discloses a technique for forming a storage node hole or contact hole having a high aspect ratio and a good shape.

However, where such a deep hole is formed, the hole becomes thinner before it reaches the contact portion. This may bring about a difficulty in making sufficient contact between the contact material inside the hole and the contact portion. Further, where the hole has a small diameter, it may be difficult to make sufficient contact, even where the hole has a good shape.

BRIEF SUMMARY OF THE INVENTION

An object of the present invention is to provide an etching method, etching system, and etching apparatus, which can form a hole having a high aspect ratio in a silicon oxide film and reaching a contact portion, while making sufficient contact between a contact material inside the hole and the contact portion.

According to a first aspect of the present invention, there is provided an etching method comprising: preparing a target object such that a first oxide film made of silicon oxide containing at least one of B and P is formed on a substrate, a second oxide film made of silicon oxide containing neither of B and P is formed on the first oxide film, and a contact portion is present below an interface between the first oxide film and the second oxide film; etching the second oxide film and the first oxide film, thereby forming a hole reaching the contact portion; and etching the first oxide film by a dry process using a gas containing HF, thereby expanding a portion of the hole adjacent to an upper side of the contact portion and inside the first oxide film.

In the first aspect, said forming a hole may be performed by plasma etching, and said expanding a portion of the hole adjacent to an upper side of the contact portion may be performed by plasma-less etching. Said expanding a portion of the hole adjacent to an upper side of the contact portion may comprise heating the substrate after the dry process using a gas containing HF. Said expanding a portion of the hole adjacent to an upper side of the contact portion may be performed under a vacuum pressure.

According to a second aspect of the present invention, there is provided an etching method performed on a structure in which a first oxide film made of silicon oxide containing at least one of B and P is formed on a substrate, a second oxide film made of silicon oxide containing neither of B and P is formed on the first oxide film, a contact portion is present below an interface between the first oxide film and the second oxide film, and a hole reaching the contact portion is formed through the second oxide film and the first oxide film, wherein the method comprises etching the first oxide film by a dry process using a gas containing HF, thereby expanding a portion of the hole adjacent to an upper side of the contact portion and inside the first oxide film.

In the second aspect, said etching by a dry process using a gas containing HF may comprise plasma-less etching. The method may comprise heating the substrate after the dry process using a gas containing HF. The dry process using a gas containing HF may be performed under a vacuum pressure.

According to a third aspect of the present invention, there is provided an etching system for processing a target object prepared such that a first oxide film made of silicon oxide containing at least one of B and P is formed on a substrate, a second oxide film made of silicon oxide containing neither of B and P is formed on the first oxide film, and a contact portion is present below an interface between the first oxide film and the second oxide film, the etching system being configured to form a hole reaching the contact portion through the second oxide film and the first oxide film, wherein the etching system comprises: a first etching apparatus configured to etch the second oxide film and the first oxide film to form a hole reaching the contact portion; a second etching apparatus configured to etch the first oxide film by a dry process using a gas containing HF, to expand a portion of the hole adjacent to an upper side of the contact portion and inside the first oxide film; and a transfer mechanism configured to transfer the target object between the first etching apparatus and the second etching apparatus.

In the third aspect, the second etching apparatus may be configured to perform etching under a vacuum pressure. The second etching apparatus may include an etching unit configured to perform etching by the dry process, and a heat processing unit configured to perform a heat process thereafter.

According to a fourth aspect of the present invention, there is provided an etching apparatus for processing a target object prepared such that a first oxide film made of silicon oxide containing at least one of B and P is formed on a substrate, a second oxide film made of silicon oxide containing neither of B and P is formed on the first oxide film, a contact portion is present below an interface between the first oxide film and the second oxide film, and a hole reaching the contact portion is formed by etching the second oxide film and the first oxide film, wherein the etching apparatus is configured to etch the first oxide film by a dry process using a gas containing HF, to expand a portion of the hole adjacent to an upper side of the contact portion and inside the first oxide film.

In the fourth aspect, the etching apparatus may be configured to perform etching under a vacuum pressure. The etching apparatus may include an etching unit configured to perform etching by the dry process, and a heat processing unit configured to perform a heat process thereafter.

According to a fifth aspect of the present invention, there is provided a computer readable storage medium that stores a program for execution on a computer, wherein the program, when executed, causes the computer to control an etching system to conduct the etching method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A preferable embodiment of the present invention will now be described with reference to the accompanying drawings.

Figure 1:
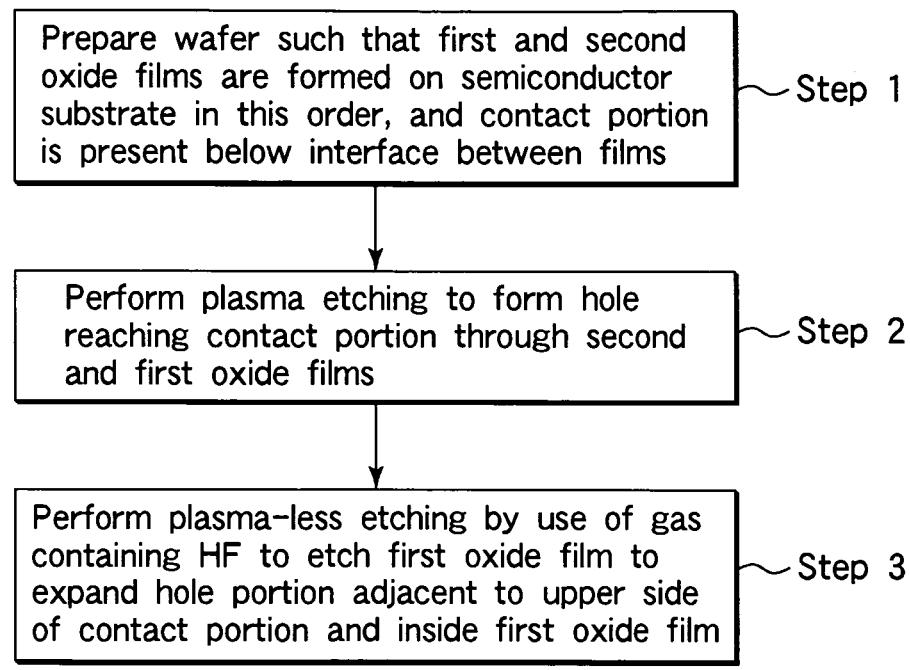
FIG. 1 is a flow chart for explaining an etching method according to an embodiment of the present invention.
Figure 2A:
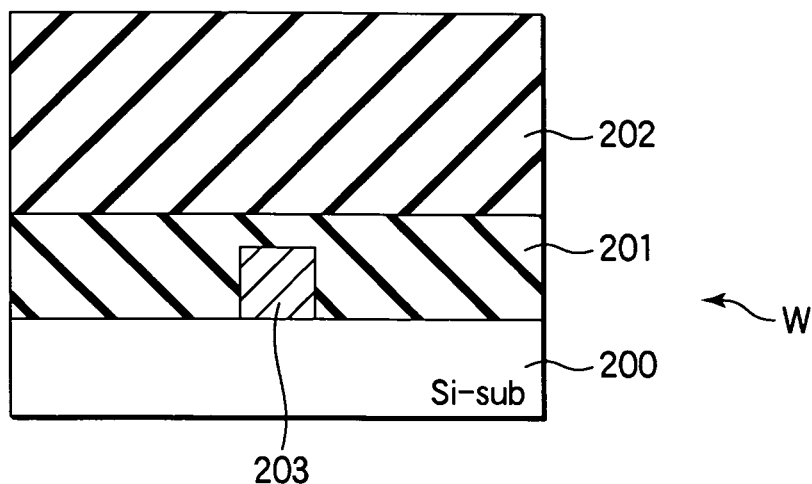
FIGS. 2A, 2B, and 2C are sectional views showing steps of the etching method according to an embodiment of the present invention.
Figure 2B:
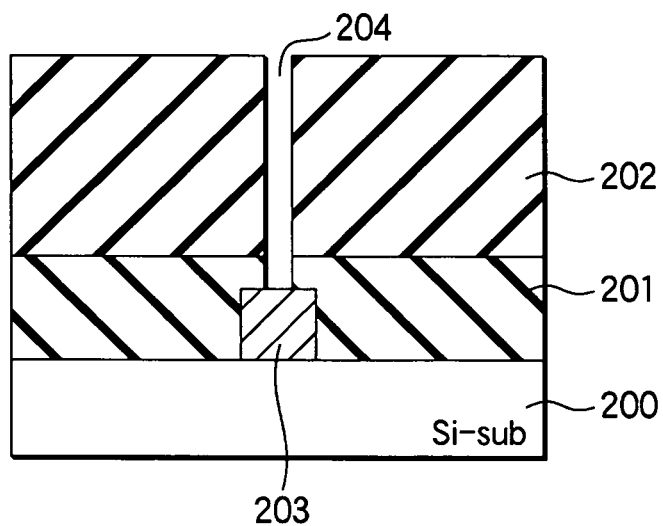
Figure 2C:
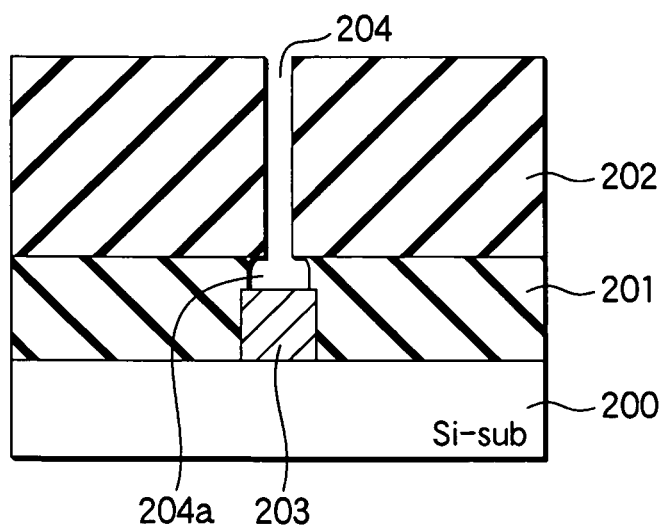

FIG. 1 is a flow chart for explaining an etching method according to an embodiment of the present invention. FIGS. 2A, 2B, and 2C are sectional views showing steps of the etching method.

At first, a target object is prepared from a silicon wafer (which will be simply referred to as a wafer) W, as shown in FIG. 2A (Step 1). Specifically, a first oxide film 201 made of silicon oxide containing at least one of B and P is formed on the surface of a semiconductor substrate 200. A second oxide film 202 made of silicon oxide containing neither of B and P, such as a TEOS or HDP film, is formed on the first oxide film 201. A contact portion 203 is present below the interface between the first oxide film 201 and second oxide film 202. Examples of silicon oxide containing at least one of B and P are BPSG (Boro-Phospho Silicate Glass) film containing both of B and P, BSG (Boro Silicate Glass) film containing B, and PSG (Phospho Silicate Glass) film containing P.

Figure 3:
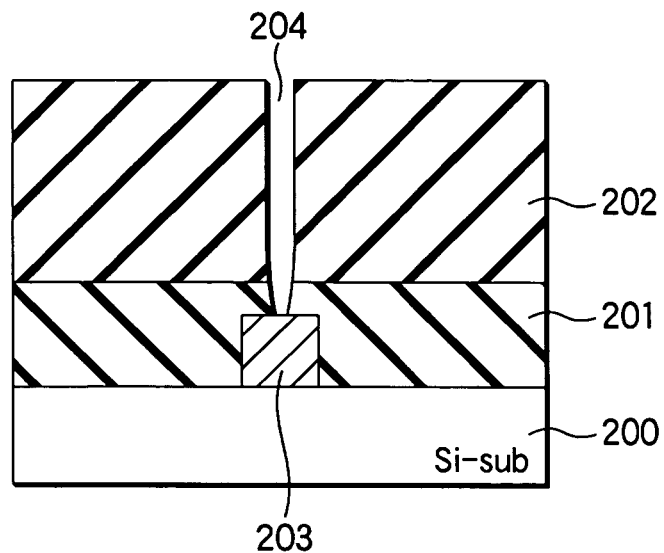
FIG. 3 is a sectional view showing an etching hole which becomes thinner before it reaches the contact portion.

Then, plasma etching is performed with a resist film or the like used as an etching mask, so that a hole 204 having a high aspect ratio and reaching the contact portion 203 is formed through the second oxide film 202 and first oxide film 201, as shown in FIG. 2B (Step 2). For this etching, a photolithography technique is used for patterning to form a photo-resist mask or the like, which is then used to perform the etching with plasma of a suitable process gas commonly used.

Where the hole 204 having a high aspect ratio is formed by etching, the diameter of the hole tends to be gradually decreased with progress of the etching. Accordingly, when the etching proceeds to the contact portion 203, the diameter of the hole becomes smaller near the contact portion 203, as shown in FIG. 3, as the case may be. In this case, when a contact material is buried in the hole, the contact area between the contact material and contact portion 203 may be so small that they cannot provide sufficient contact. Further, where the hole has a small diameter, it may be difficult to make sufficient contact, even where the hole has a good shape.

In light of the problem described above, plasma-less etching is performed by use of a gas containing HF to etch the first oxide film 201 made of silicon oxide containing at least one of B and P (Step 3). In this etching, the first oxide film 201 containing at least one of B and P is preferentially etched, while the second oxide film 202 containing neither of B and P is hardly etched. This etching is developed isotropically, so a wider hole portion 204a having a horizontally expanded shape is formed adjacent to the upper side of the contact portion 203, as shown in FIG. 2C. In other words, this etching using a gas containing HF can increase the hole diameter only near the contact portion 203 without a substantial change in the shape of the hole 204 inside the second oxide film 202. Further, this etching using a gas containing HF can provide a higher etching rate than ordinary plasma etching. In addition, this etching is plasma-less and thus has a merit such that the underlying portions and/or adjacent device portions can be hardly damaged.

Figure 4:
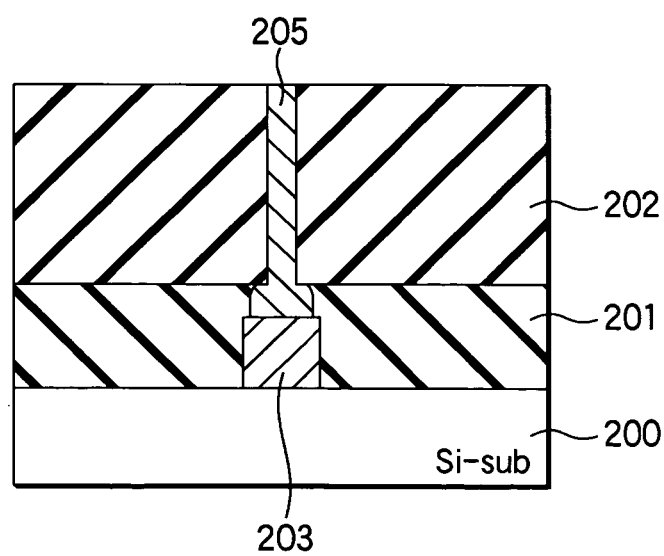
FIG. 4 is a sectional view showing a state where a wider hole portion is formed in a hole, and a contact material is buried in the hole.

As described above, the wider hole portion 204a is formed adjacent to the contact portion 203, so, when the contact material 205 is buried in the hole 204, the contact material 205 and contact portion have a larger contact area therebetween, thereby providing sufficient contact, as shown in FIG. 4.

The first oxide film 201 is etched by HF, because the first oxide film 201 is made of silicon oxide containing at least one of B and P, such as a BPSG, BSG, or PSG film, which adsorbs moisture. When HF gas is supplied in the presence of moisture, HF gas reacts with the moisture and develops etching of the first oxide film 201. On the other hand, the second oxide film 202 is made of silicon oxide containing neither of B and P, such as a TEOS or HDP film, which adsorbs essentially no moisture. Accordingly, HF gas can hardly develop etching of the second oxide film 202.

The gas containing HF may be HF gas alone or a mixture of HF gas with an inactive gas, such as $N_2$ gas or Ar gas. The gas may further contain another etching gas.

This etching is effective to form a storage node hole or contact hole having a high aspect ratio.

Figure 5:
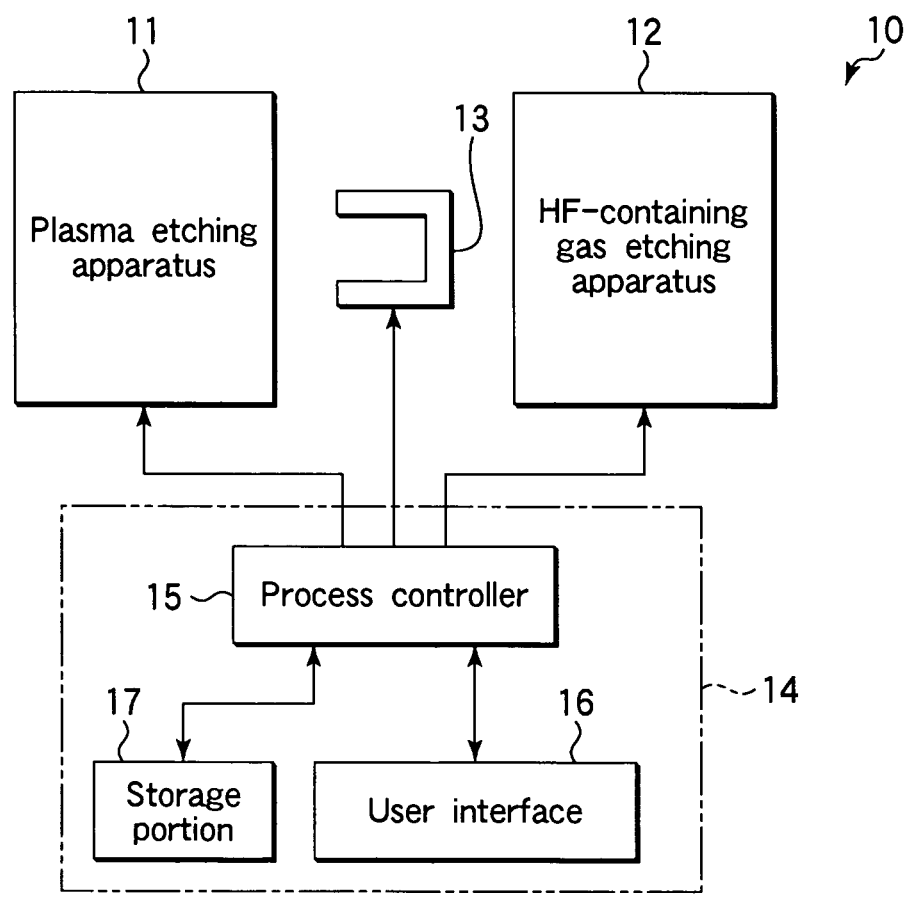
FIG. 5 is a view schematically showing the structure of an etching system used for performing an etching method according to the present invention.

Next, an explanation will be given of a specific example of an etching system for performing the etching method described above. FIG. 5 is a view schematically showing the structure of the etching system.

This etching system 10 includes a plasma etching apparatus 11, an HF-containing gas etching apparatus 12, a transfer mechanism 13, and a control section 14. The plasma etching apparatus 11 is used for performing plasma etching to form the hole 204 in the first oxide film 201 and second oxide film 202. The HF-containing gas etching apparatus 12 is used for performing plasma-less etching by use of a gas containing HF to etch the first oxide film 201 made of silicon oxide containing at least one of B and P. The transfer mechanism 13 is used for transferring a carrier C that stores wafers W between the plasma etching apparatus 11 and HF-containing gas etching apparatus 12. The control section 14 is used for controlling the process operation of the plasma etching apparatus 11, the process operation of the HF-containing gas etching apparatus 12, and the transfer operation of the transfer mechanism 13.

The plasma etching apparatus 11 may be formed of an apparatus of a type commonly used in this field, such as the capacitive coupling type using parallel-plate electrodes or the inductive coupling type.

Figure 6:
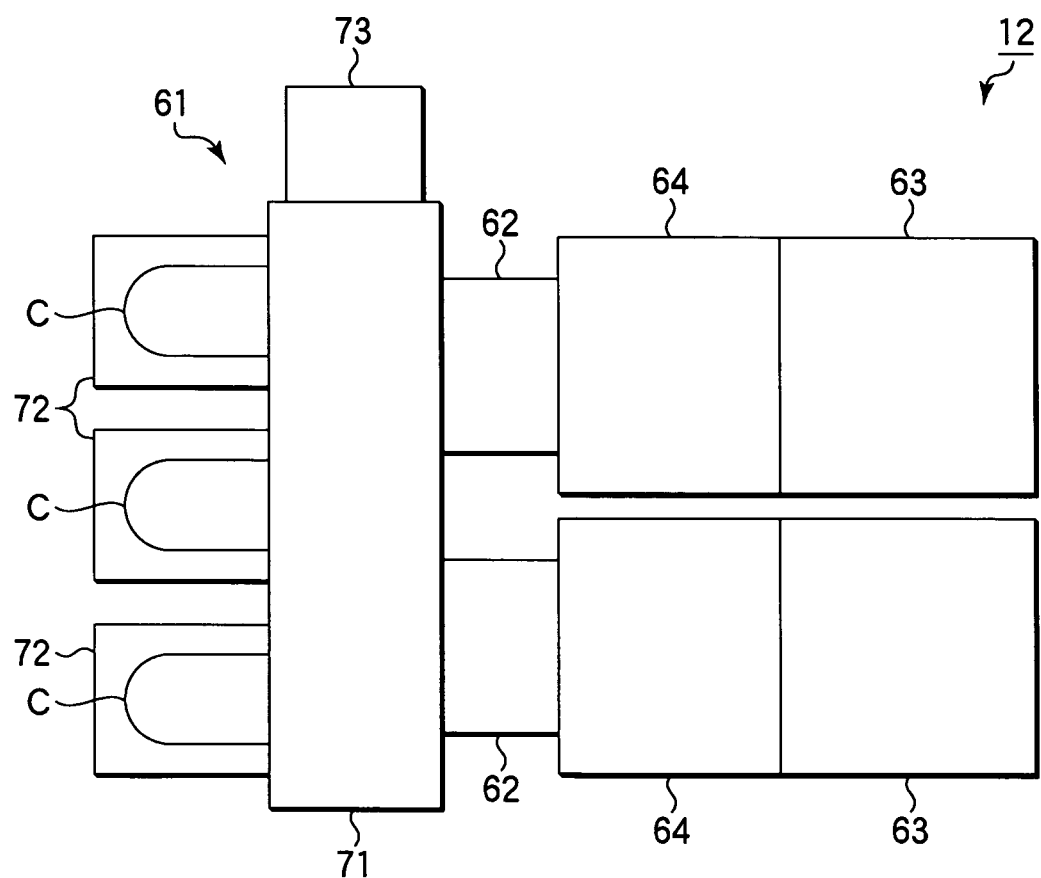
FIG. 6 is a side view schematically showing the structure of an HF-containing gas etching apparatus disposed in the etching system shown in FIG. 5.

The HF-containing gas etching apparatus 12 may be formed of the apparatus shown in FIG. 6. This apparatus includes an I/O section 61 for carrying in and out wafers W. A load-lock chamber 62 is disposed adjacent to the I/O section 61. An etching unit 63 is disposed to perform an actual etching process. A heat processing unit 64 is disposed to perform a heat process after the etching is finished.

The HF-containing gas etching apparatus 12 includes two sets of the load-lock chamber 62, etching unit 63, and heat processing unit 64. In each of the sets, the load-lock chamber 62, heat processing unit 64, and etching unit 63 are connected in series to the I/O section 61 in this order. Gate valves (not shown) are respectively disposed between the I/O section 61 and load-lock chamber 62, between the load-lock chamber 62 and heat processing unit 64, and between the heat processing unit 64 and etching unit 63, so that these portions can be selectively opened and closed.

The I/O section 61 includes a transfer chamber 71 provided with a transfer mechanism (not shown) for transferring wafers W. For example, three tables 72 are disposed on a long side of the transfer chamber 71, so that carriers C each for storing wafers W in an arrayed state are respectively placed on the tables 72. An orienter 73 is disposed adjacent to the transfer chamber 71 and configured to optically obtain the amount of eccentricity of a wafer W by rotating the wafer W, so as to perform alignment of the wafer W. The transfer mechanism disposed in the transfer chamber 71 is configured to transfer wafers W one by one among the three carriers C, orienter 73, and two load-lock chambers 62.

The load-lock chamber 62 is provided with a transfer mechanism (not shown) disposed therein, and is configured to switch between atmospheric pressure and a vacuum pressure. Specifically, the interior of the load-lock chamber 62 is set at atmospheric pressure, and the gate valve on the I/O section 61 side is opened. Then, a wafer W is transferred by the transfer mechanism of the transfer chamber 71 from a carrier C onto the transfer mechanism of the load-lock chamber 62. Then, the gate valve on the I/O section 61 side is closed, and the interior of the load-lock chamber 62 is vacuum-exhausted to a vacuum level close to the heat processing unit 64. Then, the gate valve on the heat processing unit 64 side and the gate valve between the heat processing unit 64 and etching unit 63 are opened. Then, the wafer W is transferred by the transfer mechanism to the etching unit 63. After the heat process is performed on the wafer W in the heat processing unit 64, the wafer W is returned to the load-lock chamber 62 by the transfer mechanism. Then, the gate valve on the heat processing unit 64 side is closed, and the interior of the load-lock chamber 62 is set at atmospheric pressure. Then, the gate valve on the I/O section 61 side is opened, and the wafer W is transferred to the I/O section 61.

Figure 7:
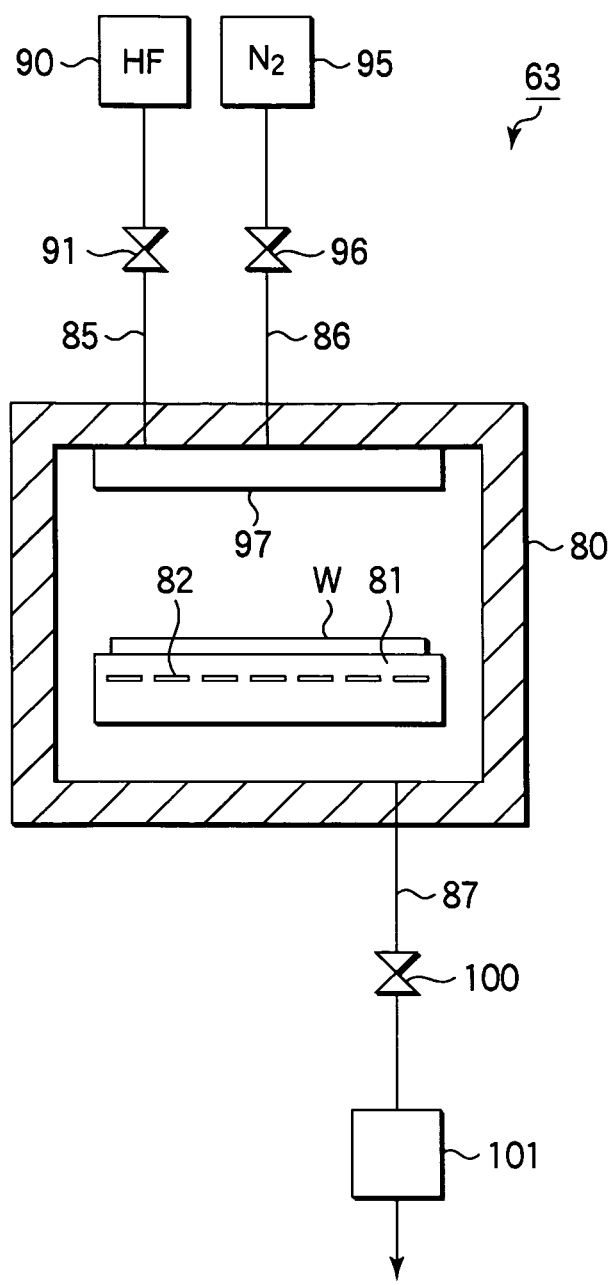
FIG. 7 is a sectional view showing an etching unit disposed in the HF-containing gas etching apparatus shown in FIG. 6.

As shown in FIG. 7, the etching unit 63 includes an airtight chamber 80 for accommodating a wafer W. A worktable 81 is disposed inside the chamber 80 to place the wafer W thereon in a horizontal state. The worktable 81 is provided with a temperature control mechanism 82 for adjusting the temperature of the wafer W at a predetermined value. The chamber 80 has a transfer port (not shown) formed in a side wall to transfer the wafer W therethrough between the etching unit 63 and heat processing unit 64.

The etching unit 63 is connected to an HF gas supply line 85 for supplying hydrogen fluoride (HF) gas used as an etching gas into the chamber 80, an $N_2$ gas supply line 86 for supplying nitrogen ($N_2$) gas used as an inactive gas or dilution gas into the chamber 80, and an exhaust line 87. The HF gas supply line 85 is connected to an HF gas supply source 90, and is provided with a flow rate adjustment valve 91 configured to open/close the line and to adjust the flow rate of HF gas being supplied. The $N_2$ gas supply line 86 is connected to an $N_2$ gas supply source 95, and is provided with a flow rate adjustment valve 96 configured to open/close the line and to adjust the flow rate of $N_2$ gas being supplied.

A showerhead 97 is disposed on the ceiling wall of the chamber 80, and is configured to deliver HF gas and $N_2$ gas, supplied through the HF gas supply line 85 and $N_2$ gas supply line 86, uniformly all over the surface of the wafer W placed on the worktable 81.

The exhaust line 87 is provided with a pressure controller 100 and an exhaust pump 101 for performing forcible exhaust. The pressure controller 100 is operated while the exhaust pump 101 is running, so that the pressure inside the chamber 80 is adjusted to a predetermined vacuum state.

Figure 8:
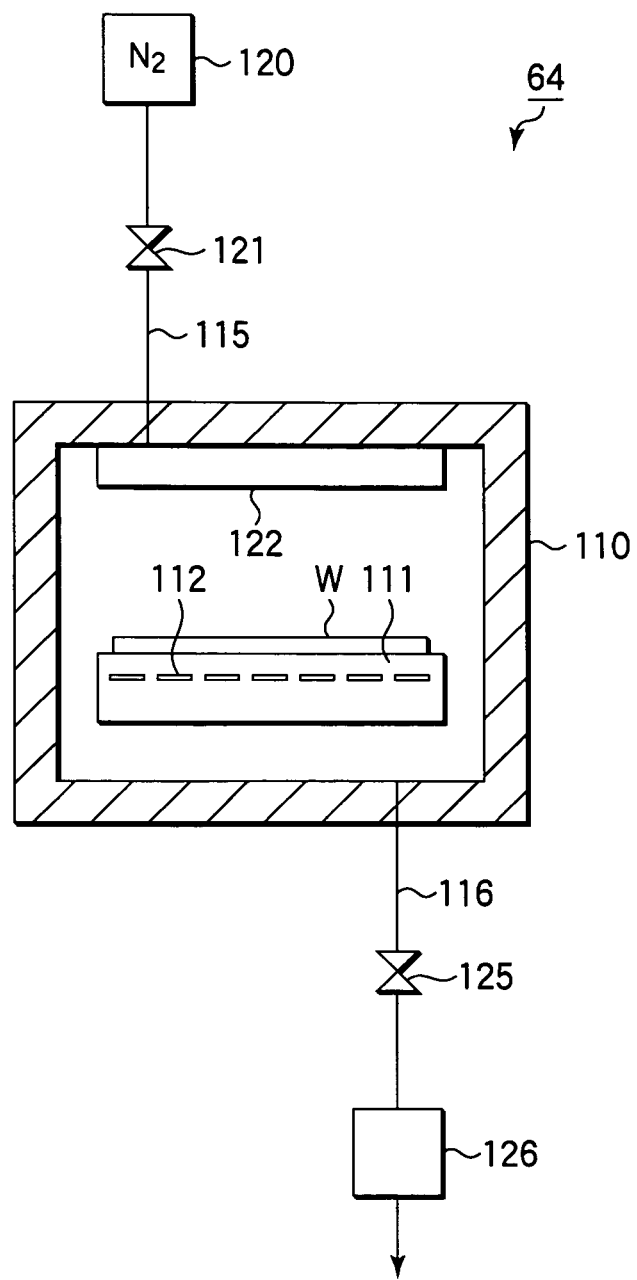
FIG. 8 is a sectional view showing a heat processing unit disposed in the HF-containing gas etching apparatus shown in FIG. 6.

As shown in FIG. 8, the heat processing unit 64 includes an airtight chamber 110 for accommodating a wafer W. A worktable 111 is disposed inside the chamber 110 to place the wafer W thereon in a horizontal state. The worktable 111 is provided with a heater 112 for heating the wafer W to a predetermined temperature. The chamber 110 has a transfer port (not shown) formed in a side wall to transfer the wafer W therethrough between the etching unit 63 and heat processing unit 64, and a transfer port (not shown) formed in a side wall to transfer the wafer W therethrough between the load-lock chamber 62 and heat processing unit 64.

The heat processing unit 64 is connected to an $N_2$ gas supply line 115 for supplying $N_2$ gas used as an inactive gas or process atmosphere gas into the chamber 110, and an exhaust line 116 for exhausting the interior of the chamber 110. The $N_2$ gas supply line 115 is connected to an $N_2$ gas supply source 120, and is provided with a flow rate adjustment valve 121 configured to open/close the line and to adjust the flow rate of $N_2$ gas being supplied.

A showerhead 122 is disposed on the ceiling wall of the chamber 110, and is configured to deliver $N_2$ gas, supplied through the $N_2$ gas supply line 115, uniformly all over the surface of the wafer W placed on the worktable 111.

The exhaust line 116 is provided with a pressure controller 125 and an exhaust pump 126 for performing forcible exhaust. The pressure controller 125 is operated while the exhaust pump 126 is running, so that the pressure inside the chamber 110 is adjusted to a predetermined vacuum state.

The control section 14 includes a process controller 15 comprising a microprocessor (computer) for practically controlling the plasma etching apparatus 11, HF-containing gas etching apparatus 12, and transfer mechanism 13 of the etching system 10. The process controller 15 is connected to the user interface 16, which includes, e.g., a keyboard and a display, wherein the keyboard is used for an operator to input commands for operating the etching system 10, and the display is used for showing visualized images of the operational status of the etching system 10. Further, the process controller 15 is connected to a storage portion 17 that stores various databases and recipes, i.e., control programs for the process controller 15 to control the etching system 10 so as to perform various processes, and control programs for the respective components of the etching system 10 to perform predetermined processes in accordance with process conditions. The recipes are stored in a storage medium included in the storage portion 17. The storage medium may be formed of a medium of the stationary type, such as a hard disk, or a medium of the portable type, such as a CDROM, DVD, or flash memory. Alternatively, the recipes may be used online while they are transmitted from another apparatus through, e.g., a dedicated line, as needed.

A required recipe is retrieved from the storage portion 17 and executed by the process controller 15 in accordance with an instruction or the like input through the user interface 16. Consequently, the etching system 10 can perform a predetermined process under the control of the process controller 15.

In the etching system 10 having the structure described above, when etching is performed as shown in FIGS. 2A, 2B, and 2C, a carrier C storing wafers W is transferred by the transfer mechanism 13 onto the I/O section (not shown) of the plasma etching apparatus 11. Then, wafers W are taken out one by one, and each of them is subjected to plasma etching performed on the first oxide film 201 and second oxide film 202 by use of a predetermined process gas to form the hole 204 reaching the contact portion 203. The process conditions used at this time are suitably determined in accordance with the apparatus type, process gas type, and so forth.

After the hole 204 is formed by the plasma etching, each of the wafers W is returned into the carrier C. After a predetermined number of wafers W are thus processed by the plasma etching, the carrier C is transferred by the transfer mechanism 13 to the HF-containing gas etching apparatus 12.

In the HF-containing gas etching apparatus 12, the carrier C is placed on the table 72 of the I/O section 61. Then, wafers W are taken out one by one from the carrier C by the transfer mechanism of the transfer chamber 71, and each of them is transferred into the load-lock chamber 62. After a wafer W is transferred into the load-lock chamber 62, the gate valve is closed to set an airtight state inside the load-lock chamber 62. Then, the interior of the load-lock chamber 62 is vacuum-exhausted to a vacuum pressure almost equal to the chamber 80 of the etching unit 63 and the chamber 110 of the heat processing unit 64. Then, the gate valve is opened, so that the load-lock chamber 62 can communicate with these units.

In this state, the wafer W is first transferred into the chamber 80 of the etching unit 63. Then, the wafer W is placed on the worktable 81 such that the device formation surface faces upward. Thereafter, the gate valve is closed to set an airtight state inside the chamber 80. Then, the temperature of the wafer W is controlled by the temperature control mechanism 82 to be at a predetermined value of, e.g., 40° C. or less. Further, the pressure inside the chamber 80 is controlled by the exhaust pump 101 and pressure controller 100 to be, e.g., 400 to 4,000 Pa (3 to 30 Torr).

In this state, HF gas is supplied, along with $N_2$ gas used as a dilution gas as needed, into the chamber 80. At this time, the flow rate of HF gas is adjusted by the flow rate adjustment valve 91 to be 1,000 to 3,000 mL/min (sccm). Where $N_2$ gas is supplied into the chamber 80 along with HF gas used as an etching gas, heat of the temperature control mechanism 82 built in the worktable 81 is efficiently conducted to the wafer W, so that the temperature of the wafer W is accurately controlled. The flow rate of $N_2$ gas thus supplied is set to be 500 to 3,000 mL/min (sccm).

When HF gas is supplied under a vacuum pressure, as described above, etching is developed by a reaction of HF gas with the first oxide film 201 made of silicon oxide containing at least one of B and P. At this time, a fluosilicate family product is generated as a reaction product. However, as described above, silicon oxide containing at least one of B and P adsorbs moisture, so the reaction is promoted in the presence of water, and the etching is thereby developed at a high etching rate.

After this dry etching process using an HF-containing gas is finished, supply of HF gas is stopped by closing the flow rate adjustment valve 91. On the other hand, supply of $N_2$ gas is maintained to purge the interior of the chamber 80 with $N_2$ gas.

When this process in the etching unit 63 is finished, the reaction product generated by HF gas is in a volatile state due to the present of moisture, so the product can be evaporated inside the chamber 80 to some extent. However, in order to remove the reaction product remaining on the etched surface, the wafer W is transferred to the heat processing unit 64, after the etching process. At this time, the gate valve between the chamber 80 and chamber 110 is opened to set the chambers 80 and 110 to communicate with each other. In this state, the wafer W is transferred by the transfer mechanism of the load-lock chamber 62 from the chamber 80 into the chamber 110 of the heat processing unit 64.

In the heat processing unit 64, the wafer W is placed on the worktable 111 such that the device formation surface faces upward. Then, the gate valve is closed to set an airtight state inside the chamber 110 to start a heat process. At this time, the temperature of the wafer W is set by the heater 112 to be at a predetermined value of 100 to 400° C. Further, the pressure inside the chamber 110 is controlled by the exhaust pump 126 and pressure controller 125 to be, e.g., 133 to 400 Pa (1 to 3 Torr). Then, $N_2$ gas is supplied into the chamber 110 at a predetermined flow rate. At this time, the flow rate of $N_2$ gas is adjusted to be 500 to 3,000 mL/min (sccm). Consequently, heat of the heater 112 built in the worktable 111 is efficiently conducted to the wafer W, so that the temperature of the wafer W is accurately controlled.

When this heat process is finished, supply of $N_2$ gas is stopped by closing the flow rate adjustment valve 121. Then, the gate valve between the heat processing unit 64 and load-lock chamber 62 is opened, and the wafer W is transferred from the heat processing unit 64 into the load-lock chamber 62. Then, the gate valve is closed to set an airtight state inside the load-lock chamber 62, and the interior of the load-lock chamber 62 is adjusted to atmospheric pressure. Then, the load-lock chamber 62 is set to communicate with the I/O section 61, and the wafer W is returned into the carrier C on the I/O section 61. After a predetermined number of wafers W are thus processed, the carrier C storing the processed wafers W is transferred by the transfer mechanism 13 out of the etching system 10.

In the etching process described above, plasma etching is performed to form the hole 204 reaching the contact portion 203 through the second oxide film 202 and first oxide film 201. Then, dry etching is performed by use of an HF-containing gas to etch a portion of the first oxide film 201 near the contact portion 203 and thereby to form the wider hole portion 204a adjacent to the contact portion 203. On the other hand, the second oxide film 202 is made of silicon oxide containing neither of B and P, such as a TEOS or HDP film, which adsorbs essentially no moisture, so etching of the second oxide film 202 can hardly be developed. Consequently, the wider hole portion 204a is formed adjacent to the contact portion 203 without a substantial change in the shape of that portion of the hole 204 which corresponds to the second oxide film 202. Thereafter, when a contact material is buried in the hole 204, sufficient contact is thereby provided.

As described above, silicon oxide containing at least one of B and P adsorbs moisture, so, when HF gas is supplied in the presence of this moisture, HF gas reacts with moisture. Consequently, the silicon oxide containing at least one of B and P is etched by a gas containing HF. On the other hand, silicon oxide containing neither of B and P adsorbs essentially no moisture, so HF gas can hardly develop etching thereof. According to the embodiment described above, a target object is prepared such that a first oxide film made of silicon oxide containing at least one of B and P is formed on a substrate, a second oxide film made of silicon oxide containing neither of B and P is formed on the first oxide film, and a contact portion is present below the interface between the first oxide film and second oxide film. Then, a hole reaching the contact portion is formed in the target object, and then a dry process is performed by use of a gas containing HF to etch the first oxide film. At this time, a portion of the hole adjacent to the upper side of the contact portion is expanded while the portion of the hole inside the second oxide film is essentially not expanded. Consequently, when a contact material is buried in the hole, the contact material and contact portion have a larger contact area therebetween, thereby providing sufficient contact.

The present invention is not limited to the embodiment described above, and it may be modified in various manners. For example, the embodiment described above is exemplified by a case where plasma etching is used to form a hole, but this is not limiting. Further, $N_2$ gas is used as an inactive gas for a dilution gas or the like, but another inactive gas, such as Ar gas, He gas, or Xe gas, may be used for the same purpose.

In the embodiment described above, an explanation has been given of the principle without specifying applications. The present invention can be applied to various types of device formation, as long as they include steps described in the embodiment.

The present invention is widely applicable to processes for manufacturing semiconductor devices, while forming a hole having a high aspect ratio, such as a storage node hole or contact hole, to make contact with a contact portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An etching system for processing a target object prepared such that a first oxide film made of silicon oxide containing at least one of B and P is formed on a substrate, a second oxide film made of silicon oxide containing neither of B and P is formed on the first oxide film, and a contact portion is present below an interface between the first oxide film and the second oxide film, the etching system comprising:
   a first etching apparatus configured to etch the second oxide film and the first oxide film by plasma etching;
   a second etching apparatus configured to etch the first oxide film by plasma-less etching using HF gas and an inactive gas, the second etching apparatus including an etching unit configured to perform the plasma-less etching under a vacuum pressure and a heat processing unit configured to perform a heat process to the target object under a vacuum pressure to remove a fluosilicate family reaction product;
   a transfer mechanism configured to transfer the target object between the first etching apparatus and the second etching apparatus; and
   a control section configured to control operation of the etching system, the control section including a computer and a computer readable non-transitory storage medium that stores a control program, wherein the control program, when executed, causes the computer to control the etching system to conduct an etching sequence which includes
   etching the second oxide film and the first oxide film, thereby forming a hole reaching the contact portion, by the plasma etching in the first etching apparatus,
   then transferring the target object from the first etching apparatus to the second etching apparatus, by use of the transfer mechanism,
   then etching the first oxide film in preference to the second oxide film by the plasma-less etching using the HF gas and the inactive gas under a vacuum pressure, thereby expanding a first portion of the hole adjacent to an upper side of the contact portion and inside the first oxide film such that the first portion becomes larger in width than a second portion of the hole inside the second oxide film, in the etching unit of the second etching apparatus, and
   then performing the heat process to the target object under a vacuum pressure to remove a fluosilicate family reaction product generated by the plasma-less etching, in the heat processing unit of the second etching apparatus.

2. The etching system according to claim 1, wherein the etching unit of the second etching apparatus includes:
   a first chamber configured to accommodate the target object;
   a first temperature control mechanism disposed inside the first chamber and configured to adjust a temperature of the target object to a predetermined value;
   a HF gas supply line connected to the first chamber and configured to supply the HE gas into the first chamber; and
   a first inactive gas supply line connected to the first chamber and configured to supply the inactive gas into the first Chamber, wherein the heat processing unit of the second etching apparatus includes:
   a second chamber configured to accommodate the target object;
   a second temperature control mechanism disposed inside the second chamber and configured to adjust a temperature of the target object at a predetermined value; and
   a second inactive gas supply line connected to the second chamber and configured to supply an inactive gas into the second chamber; and wherein the etching sequence includes:
   performing the plasma-less etching in the first chamber with. the target object placed therein, by supplying the gas and the inactive gas into the first chamber, and controlling a temperature of the target object by conducting heat from the first temperature control mechanism to the target object; and
   then performing the heat process in the second chamber with. the target object placed therein, by supplying the inactive gas into the second chamber, and controlling a temperature of the target object by conducting heat from the second temperature control mechanism to the target object.

3. The etching system according to claim 2, wherein the etching sequence further includes continuing supply of the inactive gas while stopping supply of the HF gas into the first chamber of the etching unit of the second etching apparatus after the plasma-less etching, to perform purging inside the first chamber with the inactive gas.

4. The etching system according to claim 2, wherein the etching unit of the second etching apparatus includes a first worktable disposed inside the first chamber and configured to place the target object thereon, and the first worktable is equipped with the first temperature control mechanism, and
   wherein the heat processing unit of the second etching apparatus includes a second worktable disposed inside the second chamber and configured to place the target object thereon, and the second worktable is equipped with the second temperature control mechanism.

5. The etching system according to claim 1, wherein the plasma-less etching is performed with a process temperature of 40° C. or less and a process pressure of 400 to 4,000 Pa, and the heat process is performed with a process temperature of 100 to 400° C. and a process pressure of 133 to 400 Pa.

6. The etching system according to claim 5, wherein the plasma-less etching is performed by supplying the HF gas at a flow rate of 1,000 to 3,000 mL/min, and supplying $N_2$ gas used as the inactive gas at a flow rate of 500 to 3,000 mL/min.

* * * * *